United States Patent

Brigati

[11] Patent Number: 6,104,644
[45] Date of Patent: Aug. 15, 2000

[54] CIRCUIT FOR THE DETECTION OF CHANGES OF ADDRESS

[75] Inventor: Alessandro Brigati, rue des Menudières, France

[73] Assignee: SGS-Thomson Microelectronics S.A., Gentilly, France

[21] Appl. No.: 09/013,966

[22] Filed: Jan. 27, 1998

[30] Foreign Application Priority Data

Feb. 4, 1997 [FR] France .................................. 97 01232

[51] Int. Cl.[7] .................................................. G11C 7/00
[52] U.S. Cl. .................................... 365/189.07; 365/195
[58] Field of Search ............................... 365/189.07, 195

[56] References Cited

U.S. PATENT DOCUMENTS 5,036,460  7/1991  Takahira et al. ...................... 364/200
5,682,344  10/1997  Seyyedy ................................ 365/145

FOREIGN PATENT DOCUMENTS 39 18 475  12/1990  Germany ........................ G11C 7/00

OTHER PUBLICATIONS

French Search Report from French Patent application 97 01232, filed Feb. 4, 1997.
Patent Abstracts of Japan, vol. 016, No. 068 (P–1314), Feb. 19, 1992 & JP–A–03 260993 (NEC Corp.).

Primary Examiner—Trong Phan
Assistant Examiner—M. Tran
Attorney, Agent, or Firm—Wolf, Greenfield & Sacks, P.C.; James H. Morris; Theodore E. Galanthay

[57] ABSTRACT

A memory is provided with an addressing circuit comprising an address bus to convey address signals, biasing and selector switch circuits connected to the address bus for the selecting and biasing of lines of the memory and write circuits for the writing of data in cells of the memory. The memory comprises an enabling circuit to enable an operation of writing in memory. This enabling circuit comprises a circuit to memorize a designated address or to write data elements, a comparison circuit to compare a current address available on the address bus with the designated address and a blocking circuit to prevent the writing when the comparison reveals a difference of address.

13 Claims, 4 Drawing Sheets

CIRCUIT FOR THE DETECTION OF CHANGES OF ADDRESS

BACKGROUND OF THE INVENTION

1. Field of the Invention

The present invention provides a circuit for the detection of changes of address when a word line in a memory is being addressed. It relates particularly to memories whose memory cells comprise floating-gate transistors acting as storage elements. The programming of these cells is generally performed either by generating a saturation current or by creating an electrical field effect in this floating-gate transistor. Such memories include EPROM or EEPROM type memories. However, the invention may be applied to other types of memory. One particular feature of the invention is that it deals with the problems that arise on a data bus during a long period of writing, namely during programming or erasure periods.

2. Discussion of the Related Art

In the case of EEPROM type memories, each information storage element or memory cell consists of a floating-gate transistor. This type of transistor may have two states. Thus, in the case of an N channel MOS transistor, in a first state, either no charge or a positive charge is trapped at the floating gate. A conduction channel may exist between the source and the drain. The transistor is then conductive and behaves like a closed switch. In a second state, electrons are trapped at the floating gate. They therefore prevent the creation of a conduction channel in the substrate between the source and the drain. In this case, the transistor is off and behaves like an open switch.

The programming of the floating-gate transistor of an EEPROM type memory cell is obtained by subjecting the drain and source regions of this transistor to a potential that has a higher value compared with the potential to which the control gate of this transistor, superimposed on the floating gate, is subjected. The programming therefore requires that at least one of the drain and source regions should be subjected to a high voltage VPP.

A particular application of the invention is that of programming in page mode. In such a mode, the programming of several memory cells connected to one and the same word line of the memory array is done at the same time. This mode of programming is very useful for it enables access to several memory cells of the memory array at the same time. Indeed, rather than performing the programming of the memory cells one after the other, in order to reduce the programming time, inasmuch as the cells are distributed at the intersections of bit lines and word lines, it is preferable firstly to select a set of bit lines and, secondly, to select a word line for the programming at the same time of all the memory cells belonging to these bit lines and to this word line. Then the word line may be changed to access a new set of memory cells belonging to these bit lines and to this new word line.

The programming, in page mode, of cells of an EEPROM type memory is done in several steps. Firstly, the selection of the bit lines is neutralized and, during this neutralization, all the bit lines are precharged at a high potential. Then, the bit lines are selected by selectively eliminating the neutralization. Finally, for the programming of the memory cells, a zero potential is imposed on the control gates of the floating-gate transistors of the memory cells to be programmed. Thus, only the selected transistors get programmed. It must be noted that these selected transistors have not been programmed during the precharging because, at this time, the transistors providing access to these cells are off. The transistors are turned off by a command applied to their control gate.

However, this precharging of the bit lines lasts long enough for it to be possible to prompt a change in the address of a word line. This change may arise out of any cause such as a parasite or a control error. The circuits proposed in the prior art naturally take account of this change of address. Thus, a programming or erasure of the cells is done on a word line that is different from the word line selected beforehand by the user.

SUMMARY OF THE INVENTION

The present invention overcomes this problem by providing a circuit for the detection of a possible change of address of a word line prompted during an operation for the writing or programming of memory cells, especially the memory cells of an EEPROM type memory. The principle of the invention consists of the memorizing, at each write operation, of the read address and of the validation of this write operation so long as an address available at the address bus corresponds to the memorized address.

Consequently, an object of the present invention is a memory provided with an addressing circuit comprising an address bus to convey address signals, selector circuits connected to the address bus for the selecting and biasing of lines of the memory and write circuits for the writing of data in cells of this memory, wherein said memory comprises an enabling circuit activating the write circuits to enable an operation of writing in memory, this enabling circuit comprising a circuit to memorize a designated address or to write data elements, a comparison circuit to compare a current address available on the address bus with the designated address and a blocking circuit to prevent writing when the comparison reveals a difference.

BRIEF DESCRIPTION OF THE DRAWINGS

Other features and advantages of the invention shall appear from the following description of various embodiments. The description and the drawings are given purely by way of example and in no way restrict the scope of the invention. Of these drawings.

DETAILED DESCRIPTION

Figure 1:
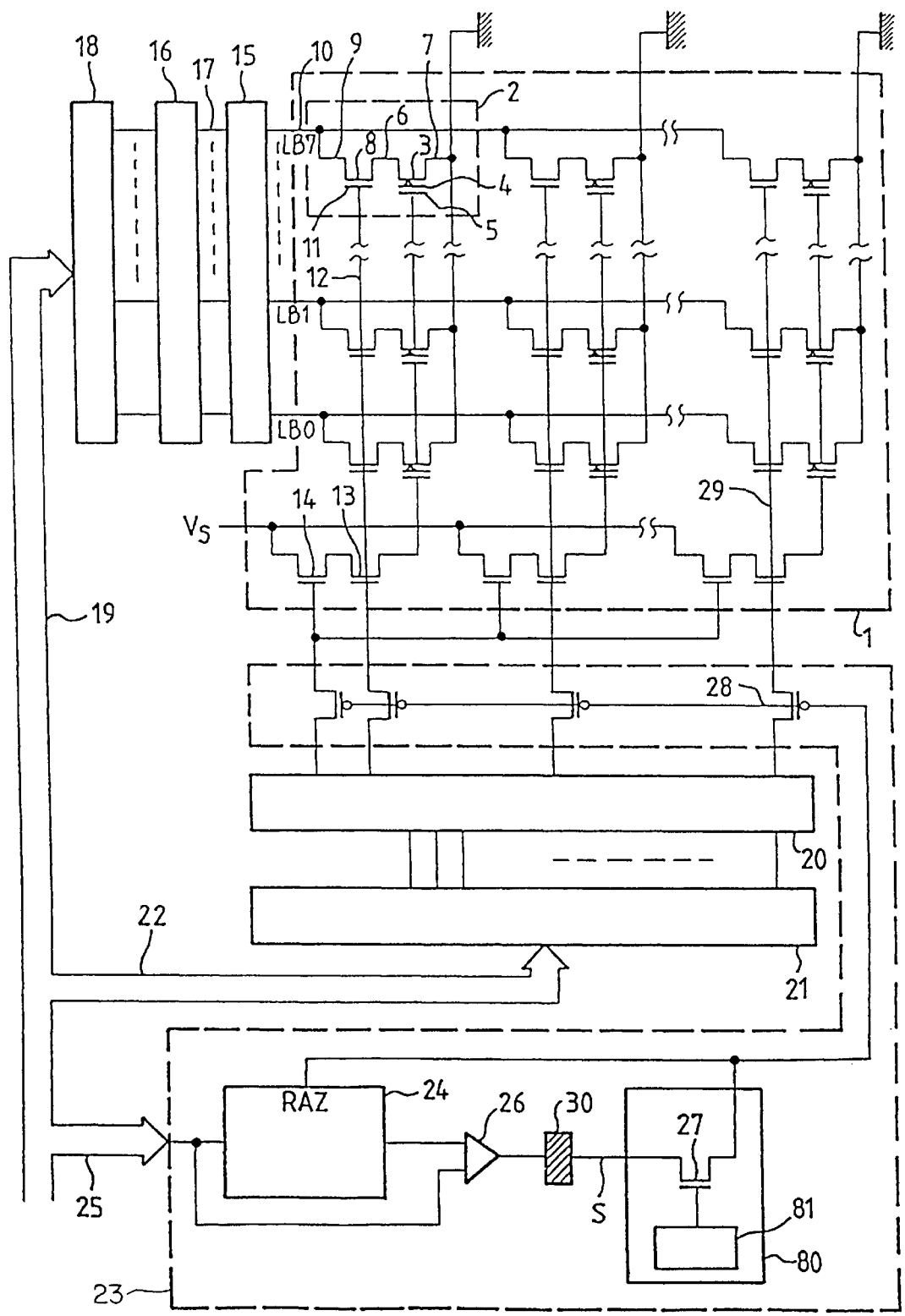
FIG. 1 shows a schematic view of an EEPROM type memory according to the invention.

FIG. 1 shows a memory 1 according to the invention. This memory 1 has memory cells such as 2. In the example, the memory 1 is an EEPROM type memory and each of its cells 2 has a floating-gate transistor 3. This transistor 3 has a floating-gate transistor 4, a control gate 5 superimposed on the floating gate, a drain 6 and a source 7. The floating-gate transistor of each memory cell is herein series-connected by its drain 6 with the source of an access transistor 8 whose drain 9 is connected to a bit line 10 and whose control gate 11 is connected to a word line 12. The source 7 of the transistor 3 is connected to the ground.

Memory 1 is provided with an addressing circuit comprising an address bus 19 to convey address signals. The number of address lines depends on the size of the memory. Lines of the address bus 19 are connected to the input of bias and selector switch circuits 18 and 21. The circuits 18 and 21 are capable of biasing and switching over to (i.e. selecting) the bit lines 10 and word lines 12 of the memory. Circuits 16 and 20, each comprising a set of volatile memory cells connected at output to circuits 18 and 21, are used respectively to memorize the address of a selected bit line and the address of the selected word line. The circuit 16 is connected to a write circuit 15 to write data elements in the cells of the memory 1.

The memory 1 furthermore comprises, according to the invention, an enabling circuit 23 to enable an operation of writing in memory. This circuit 23 has a circuit 24 to store a designated address AD, where it has previously been decided to write data elements. A part 25 of the address bus 19 containing address bits of a word line to be programmed is connected to the input of the circuit 24. The output of the circuit 24 is connected to a first input of a comparator 26. The comparator 26 has the function of comparing a designated address AD present in the circuit 24 and a current address AC present in the address bus 25. This address AC is directly transmitted to a second input of the comparator 26. The output of this comparator 26 is connected to the input of a blocking circuit 30 to prevent writing when the comparison reveals a difference in address.

In a schematic practical embodiment, this circuit 30 is connected at its output to the main electrode of an N type transistor 27. The transistor 27 is controlled by a rhythmical circuit 81. The transistor 27 and the circuit 81 form a circuit 80. The circuit 80 is used to constitute periods or cycles during the working of the memory 1. The other main electrode of the transistor 27 controls P type transistors 28, all interposed between the memory 1 and the volatile memory circuit 20. The signal coming from the transistor 27 is applied to the control gates of the transistors 28 as well as to one of the inputs of the circuit 24. One of the main electrodes of the transistors 28 is connected to a word line such as 12. Another of their main electrodes is connected to the output of the volatile memory 20.

Figure 2:
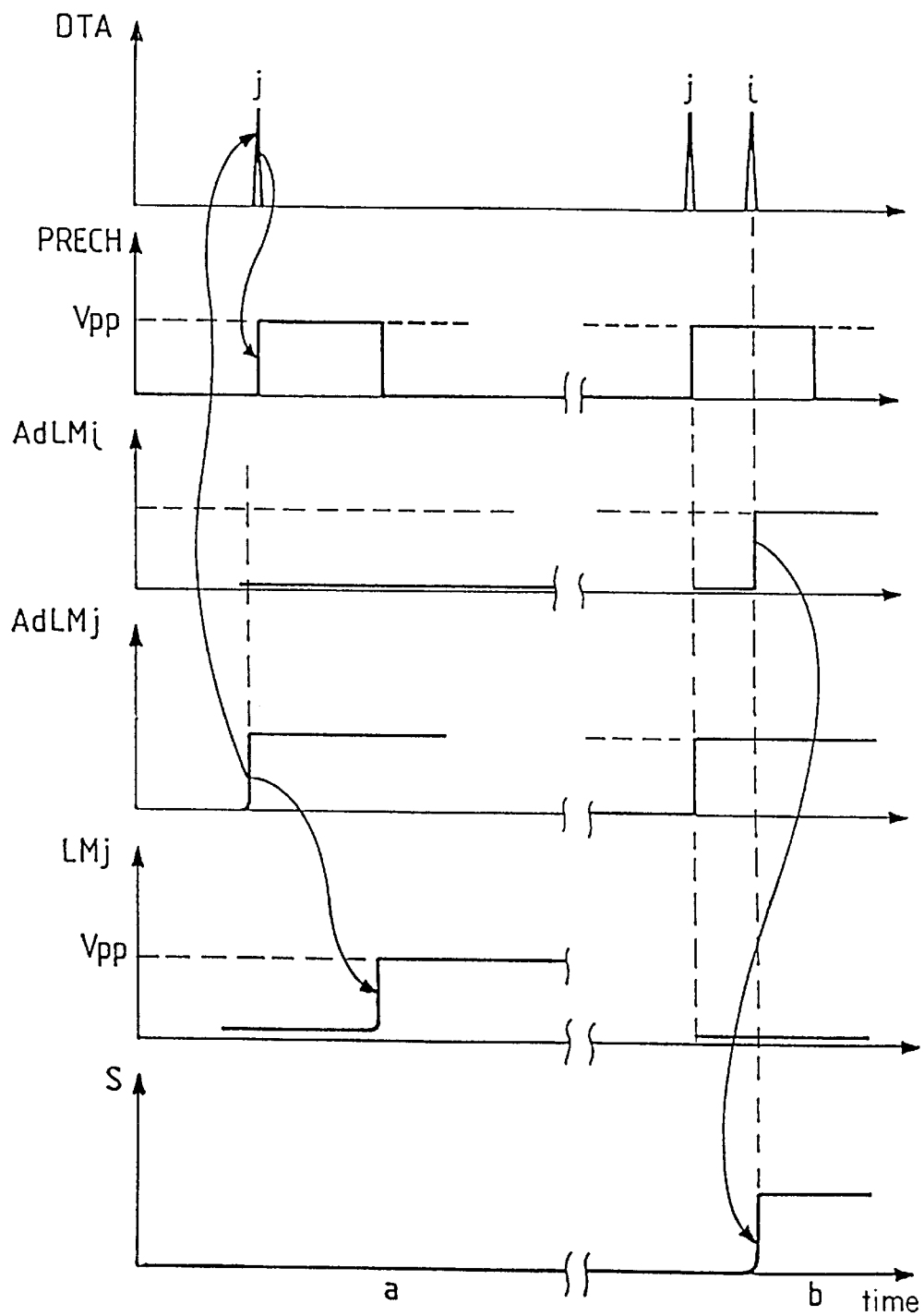
FIG. 2 shows timing diagrams of signals used during the programming of memory cells of the memory of FIG. 1.

FIG. 2 shows timing diagrams of signals present in the circuit of FIG. 1. A precharging signal PRECH is the one applied to the bit lines such as 10. The figure shows the arrival of an address signal AdLMj corresponding to the desired selection of a word line. In the left-hand and right-hand parts of FIG. 2, the signal AdLMj undergoes expected changes. The changes occur at the start of the precharging when an address transition detector (not shown) detects a signal DTA of an address transition j to address the word line j to be selected.

On the left-hand side of FIG. 2, there is no production of an untimely address signal during the execution of a write operation. The writing (or programming) occurs normally at the designated address j. The right-hand part of FIG. 2 on the contrary shows a parasitic address signal AdLMi produced during the preparation for writing on the selected word line j.

A signal LMj pertaining to the selected word line becomes active at the end of the precharging when the enabling circuit 23 allows the programming of the cells of the selected word line. The signal LMj represents the potential applied to the word line in question, for example the line 12.

During the precharging of the bit lines, the precharging signal of the write circuit 15 is at high potential, at VPP, to enable the bit lines to attain the programming potential VPP. During this precharging, the signal LMj remains at 0. During this precharging, the bit lines cannot get discharged. When the precharging is ended, the selected cells of the memory are programmed, without any problem at this point of time, by permitting the transmission of the signal LMj to the selected word line.

On the right-hand part of FIG. 2, the same signals are applied. However, during the precharging operation, the address of the word line changes. For example the parasitic word line i is selected. The enabling circuit 23 comes into play at this precise time. The comparator 26 detects a transition of the address of the word line. This comparison is done by comparing the address j memorized in the circuit 24 with the address i available on the bus 25. The blocking circuit 30 producing a signal S has the function of stopping the programming by means of the transistors 28 that have been made open by the reception of the output signal S of the circuit 30. The signal S can also be seen in FIG. 2. It becomes active at the time of the appearance of the parasitic address.

Figure 3:
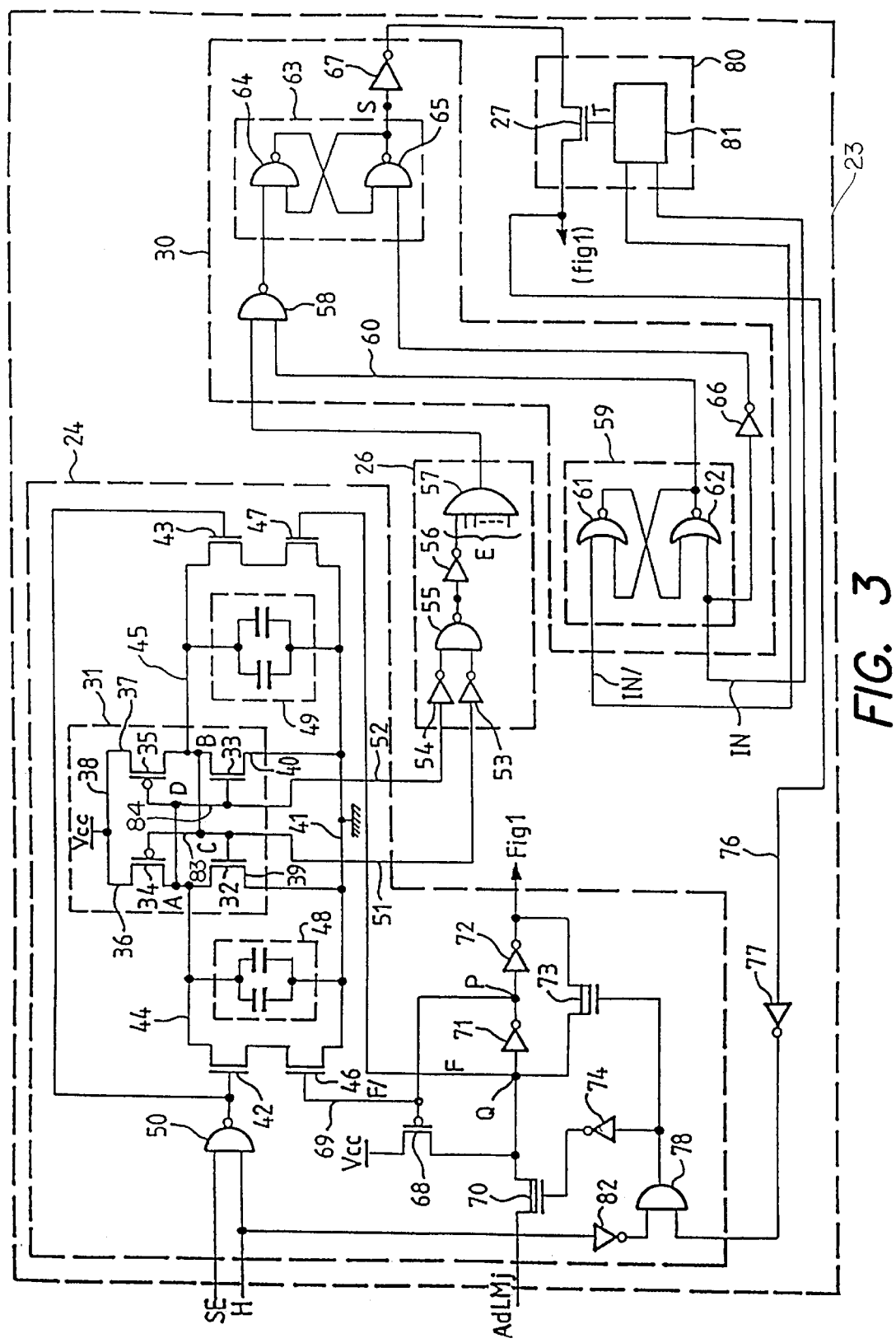
FIG. 3 shows an enabling circuit according to the invention.

FIG. 3 shows a preferred embodiment of the enabling circuit 23 according to one embodiment of the invention. This circuit 23 has a circuit 24 to store a designated address AD where data elements are to be written, a storage circuit 26 to compare a current address AC available at the address bus with the designated address AD and a blocking circuit 30 to prevent the writing when the comparison reveals a difference in writing. The circuit 24 has a bistable circuit 31.

In one example, this circuit 31 has four transistors. These are two N type transistors, respectively 32 and 33, and two P type transistors, respectively 34 and 35, mounted together as a Schmitt trigger. The two transistors 34 and 35 have their main electrodes 36 and 37 connected to a connection 38 that is itself connected to a supply VCC. These transistors, 34 and 35 respectively, are series-connected by their other main electrode with the other two transistors, 32 and 33 respectively, through two terminals A and B. The other main electrodes 39 and 40 of the two transistors 32 and 33 are connected to a connection 41 that is connected to the ground. The control gate electrodes of the two transistors 34 and 35 are connected respectively to the control gate electrode of the two transistors 32 and 33 by means of two connections, 50 and 51 respectively. The terminals A and B are respectively connected to the terminals D and C. The terminals A and B form the outputs of the circuit 24.

The terminals A and B are respectively connected to main electrodes of two enabling transistors 42 and 43 by means of a connection 44 and 45 respectively. The transistors 42 and 43 have their other main electrode connected respectively to the main electrode of two other transistors 46 and 47. The transistors 46 and 47 are connected to the ground by their other main electrode by means of the connection 41. Two decoupling capacitors 48 and 49 are connected respectively, by one of their terminals, to the connection 44 or 45. The other terminals of the two capacitors are connected together to the ground. In one embodiment, the capacitors 48 and 49 may comprise parallel-connected capacitors. The control gates of the transistors 42 and 43 are connected together to a same output of a NAND gate 50 receiving, at its two inputs, firstly a write signal SE and secondly a clock signal H.

The two outputs A and B of a bistable circuit 31 are connected to the inputs of the address comparator 26 by means of two connections 51 and 52. These two connections 51 and 52 are connected respectively to the inputs of two inverters, 53 and 54 respectively. The outputs of these two inverters 53 and 54 are connected to a two-input NAND gate

55. This gate 55 is connected at output to the input of another inverter 56. The inverter 56 is connected by its output to an OR gate 57 with several inputs E. The number of inputs E of this gate 57 corresponds to the number of address bits used to address a word line. There are as many circuits 24 in the circuit 23 as there are address bits to address the word lines. The output of this gate 57 is the output of the circuit 26.

This output is connected to the blocking circuit 30. The circuit 30 has a two-input NAND gate 58, one of the inputs receiving the output signal of the comparator 26. The other input of this gate 58 is connected to the output of a flip-flop circuit 59 by means of a connection 60. The flip-flop circuit 59 is used to inhibit the working of the circuit 30 during the storage of the designated address AD, namely the right address, the address that is really to be selected. This RS type flip-flop circuit 59 consists of two NAND gates 61 and 62. The output of the gate 62 is connected both to the connection 60 and to the input of the gate 61. The output of the gate 61 is connected to the input of the gate 62. Each of the gates 61 and 62 has one input controlled by a signal. The gate 62 is controlled by an inhibition signal IN and the gate 61 is controlled by a signal IN/ complementary to the signal IN. The signals IN and IN/ come from the circuit 81.

The output of the gate 58 controls one of the inputs of another flip-flop circuit 63 that is equivalent to the flip-flop circuit 59. The NOR gates have simply been replaced by NAND gates 64 and 65. This flip-flop circuit 63 is used to store an appearing address difference and maintain the prevention of writing up to the end of a writing cycle. The input of the gate 65 is connected to the input of the gate 62 by means of an inverter 66. The inverter 66 is used to control the flip-flop circuits 59 and 63 in opposite states. The flip-flop circuit 63 is connected at its output to an inverter 67 capable of giving the signal S at its output. The output of the inverter 67 is connected to a circuit 80.

The circuit 80 comprises a transistor 27 series-connected between the input and the output of the circuit 80. The circuit 80 produces a periodic signal T. The signal T is a signal produced at the start of a write signal and is held throughout the duration of such a cycle. The holding duration is the range of 150 microseconds. The signal T is applied to the gate of the transistor 27. The circuit 80 is also used to reset the storage circuit 24. The resetting is done by the inhibition, for example, of the clock signal H. To this end, the output of the circuit 80 is connected by a connection 76 to an inverter 77. The output of this inverter 77 is connected to an input of a two-input AND gate 78. The gate 78 is controlled at its other input by the clock signal H which has been previously inverted for reasons of convenience by an inverter 82.

Furthermore, the control gate of the transistor 46 is connected to the output of an inverter 71 and to the control gate of a P type transistor 68 by means of a connection 69. One of the main electrodes of this transistor 68 is taken to the potential VCC while its other main electrode is connected to a terminal Q.

The control gate of a transistor 47 is directly connected to this terminal Q. This terminal Q is connected both to a main electrode of an N type depleted transistor 70 and to the input of two series-connected inverters 71 and 72. The midpoint of the inverters 71 and 72 is the node P. The output of these two inverters is connected to the input of the word line decoder. The output of these two inverters is connected to the terminal Q by means of an N type depleted transistor 73. The assembly consisting of the two inverters 71 and 72 and the transistor 73 forms a loop. The control gate of the transistor 70 is connected to the output of an inverter 74. The control gate of the transistor 73 as well as the input of the inverter 74 both receive the signal coming from the gate 78. This inverter 74 is used to control the two transistors 70 and 73 in opposite states. The other main electrode of this transistor 70 is connected to an input of the circuit 24 which receives a bit of a given rank of the current address AC (that of the address AdLMj when a selection is made, and AdLMi in the case of a parasite). The other circuits 24 receive the other word line address bits.

Figure 4:
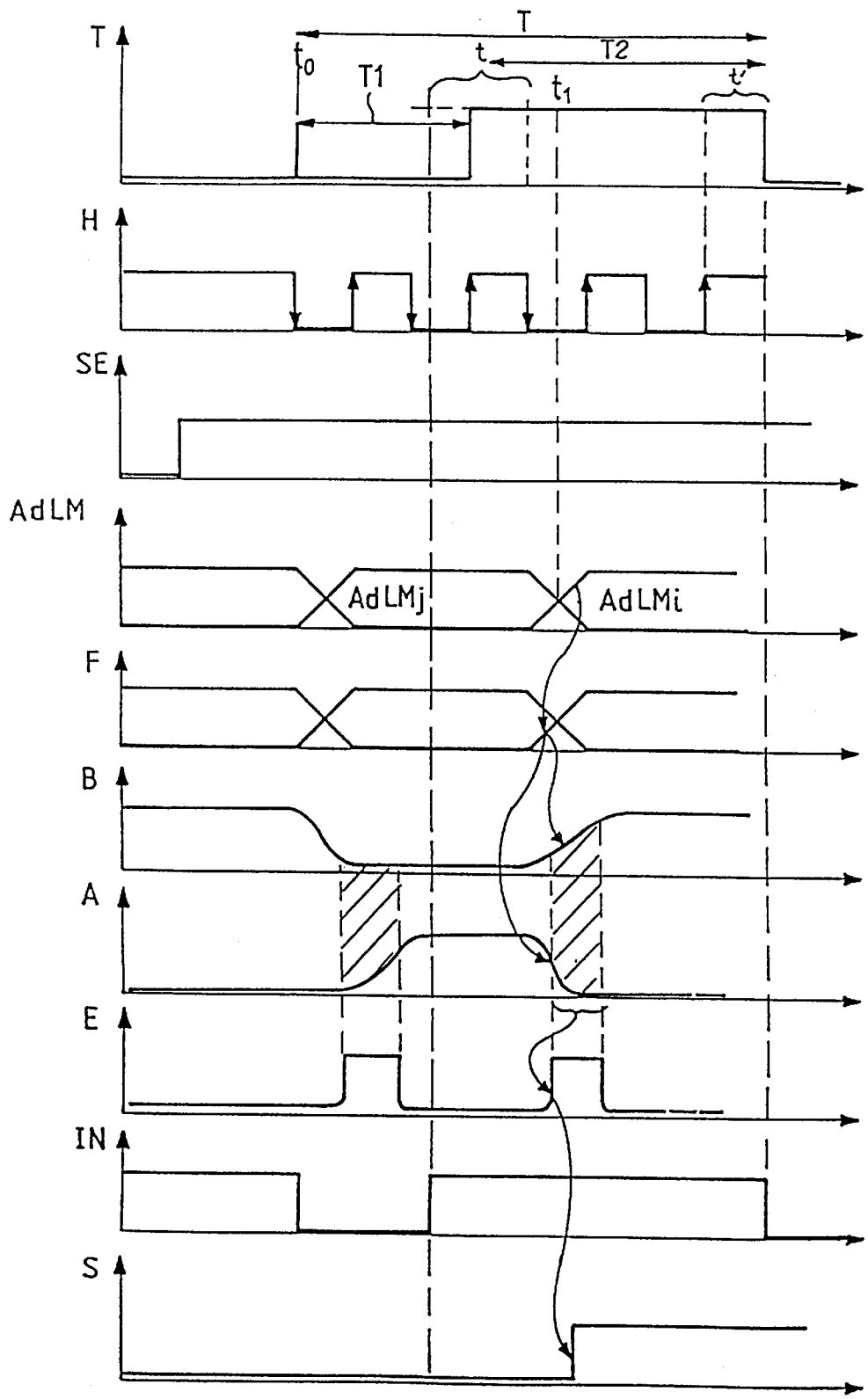
FIG. 4 shows timing diagrams of the main control signals of the circuit of FIG. 3.

FIG. 4 shows the timing diagrams of the signals used in the circuit of FIG. 3.

First of all, the circuit 80 is used to constitute periods with a duration T. A write control signal SE is applied when it is sought to write in the memory. In this case, the periodic bistable circuit 80 is put into operation in a known way. The clock signal H transmitted by the gate 78 is used for transmission and then to hold a bit of the current address AC in the circuit 68–74. The bit of this address AC is compared with the value present in the storage circuit 31. In general, the value M, initially present in this storage circuit 31 at the time of the first leading edge of the write signal SE, is different from the address bit AC. A comparison between the values of the address bit AC and M therefore generally reveals a difference. Since this is the designated address, it is necessary first of all to take it into account and secondly to neutralize the disabling by the circuit 30 that could result therefrom.

For this purpose, a signal IN temporarily produced by the active edges of the signal T (the trailing edges) comes into play in order to inhibit the working of the blocking circuit 30. Furthermore, the current address bit AC gets memorized in the circuit 24: it is necessary to switch over the bistable circuit 31 (or not switch it over depending on its value). The new address bit present in the circuit 31 and the other bits of the address AC present in the other circuits 31 constitute the designated address AD. This address AD corresponds to the word line to be programmed. Once the bit of the current address AD is latched, there are complementary signals F and F/ available at the nodes Q and P respectively.

The control gate of the enabling transistors 42 and 43 receives the output signal of the gate 50. When the output signal of the gate 50 is equal to 1, the nodes A and B are connected to the ground by the placing, in a state of conduction, of the transistors 42 and 46 or 43 and 47 depending on the value of F (or F/). In one case, where the terminal B is at a level 1, the potential of this terminal B gets discharged swiftly through the two transistors 43 and 47. This swift discharge is chiefly due to the width of the two transistors 43 and 47. The ratio W/L, namely the ratio between the width of the channel and the length of the channel, of these two transistors is in one example in the range of 12/0.7. On the other hand, the terminal A is at the level 0. The potential of A will rise to 1 because the circuit 31 is a bistable flip-flop circuit. However, the ratio W/L of the P type transistor 34, like that of the transistor 35, is in the range of 6/3. These transistors are therefore highly resistive. The potential 0 therefore takes more time to rise to 1. The potential of the terminal B will therefore fall to the level 0 faster than the potential of the terminal A rises to the level 1.

A time therefore comes when the two potentials at the terminals A and B will both be at the level 0, for a brief instant of time. This brief instant is represented by hatched lines in FIG. 4. It corresponds to the periods when the signal E, namely any of the signals allowed through the gate 57, is taken to 1. A new state of the circuit 31 is set up. The new stored value corresponds to the designated address AD.

The inhibition signal IN may, after this instant, become active. Thus, the circuit 59 will no longer stop the operation of the blocking circuit 30 because its output, taken to 1, now enables the working of the NAND gate 58. The detection of a change in address, if any, therefore begins with the switching over of the signal IN which itself follows the taking into account of the designated address.

If the value of an address bit applied to the input of the circuit 24 does not vary, no change is detected and the programming takes place without any problem.

A change in address at the instant t1 shall now be envisaged. In one example, the value of a bit of the current address goes from 1 to 0. This value of an address bit at 0 is latched to the leading edge of the clock signal H, in the circuit 68–74. This value is held at the same level up to the time when the address bus might deliver another address. The change in address of the date t1 prompts or does not prompt a switching-over of the circuits 31 depending on whether the address bit concerned by a circuit 31 has been modified or not modified by this change. For at least one of the bits of the address, there will be a switching-over of the circuit 31. For the circuit 31 which switches over, the potentials of the two terminals A and B will switch over, one at high speed and the other slowly. In this way, the potentials of the terminals A and B of this circuit 31 will be at 0 for a brief instant. The gate 57 detects the change in address at any of the circuits 31. The curved arrows show the consequence of the undesired change in address AdLMi on the signal F, the signals A and B, the signal E at input of the gate 57 and the resulting signal S.

The inhibition signal IN at the level 1 then permits the operation of the flip-flop circuit 63. This flip-flop circuit 63 switches over and, at its output, gives a signal with a level 1 characteristic of a change in address at the time of such a change in address. It is then necessary to inhibit the programming.

The output signal S/ of the flip-flop circuit 63 is transmitted to the transistors 28 under the control of the circuit 80. The circuit 80, after a period T1 after the date t0, produces an active signal in the high state for a duration T2. In the course of the duration T2, the transistor 27 is turned on. The transistor 27 then permits the transmission of the signal S to the transistors 28.

Adjustments may be made to the duration Ti to make it minimal. It is minimal when it is used to capture the designated address only. The period T2 may be lengthy, and may go up to the end of the precharging (see FIG. 1). However, for reasons of rebound on the address bus, a new address may be placed on the bus and it is possible that this new address may correspond to the designated address AD itself. To then permit the programming (since the address is the right one), the duration T2 is made short and placed at the end of the precharging. The square-wave portions shown in dashes indicate that T2 may be short and placed at the end of the cycle. Preferably, the signal IN produced by the circuit 80 (or another circuit) will be triggered as early as possible after the end of the minimum period T1. For example, IN is synchronized with this minimum period T1.

This may lead to having a signal T with two square waves t and t'. In this case, t is short: it is used only to activate IN. In this case, IN is reset at the end of the square wave t'. In this case, the working of the gate 78 must also be modified.

Having thus described at least one illustrative embodiment of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed is:

1. A memory having an addressing circuit comprising:
   an address bus to convey address signals;
   biasing and selector switch circuits connected to the address bus for the selecting and biasing of lines of the memory; and
   write circuits for the writing of data in cells of the memory, wherein said memory comprises
   an enabling circuit connected to the write circuits to enable an operation of writing in the memory, this enabling circuit having a circuit for storing a designated address or writing data elements, the enabling circuit comprising:
      a comparison circuit to compare a current address available on the address bus with the designated address; and
      a blocking circuit to prevent writing when the comparison reveals a difference of address;
   wherein the storage circuit comprises two enabling transistors put into operation by a write control signal.

2. A memory according to claim 1, wherein the blocking circuit comprises a flip-flop circuit to inhibit its operation during the storage of the designated address.

3. A memory according to claim 1, wherein the blocking circuit comprises a flip-flop circuit to memorize the appearance of a difference in address and maintain the prevention of writing.

4. A memory according to claim 1, wherein the enabling circuit comprises a circuit to constitute periods during the operation of the memory, this period-constituting circuit being connected to the enabling circuit in order to reset it.

5. A memory according to claim 2, wherein the blocking circuit comprises a flip-flop circuit to inhibit its operation during the storage of the designated address.

6. A memory according to claim 2, wherein the blocking circuit comprises a flip-flop circuit to memorize the appearance of a difference in address and maintain the prevention of writing.

7. A memory according to claim 1, wherein the enabling circuit comprises a circuit to constitute periods during the operation of the memory, this period-constituting circuit being connected to the enabling circuit in order to reset it.

8. A memory according to claim 2, wherein the enabling circuit comprises a circuit to constitute periods during the operation of the memory, this period-constituting circuit being connected to the enabling circuit in order to reset it.

9. A method for detecting changes of address in a memory comprising the steps of:
   comparing a currently available address with a designated address, to determine if there exists a difference in address, the designated address being an address of a designated memory location; and
   blocking, as a result of the comparing step, a writing operation to the designated memory location if the comparing step determines that the difference in address exists;
   wherein the blocking step includes the steps of:
      storing an appearance of the difference in address; and
      preventing writing to the designated memory location.

10. The method of claim 9, further comprising the step of writing, as a result of the comparing step, a data element to the designated memory location.

11. The method of claim 10, further comprising the step of storing, as a result of the comparing step, the designated address.

12. The method of claim 9, further comprising the step of storing, as a result of the comparing step, the designated address.

13. The method of claim 9, wherein the blocking step includes the step of inhibiting an operation of a flip-flop circuit.

* * * * *